United States Patent
Mathuni

[11] Patent Number: 5,945,351
[45] Date of Patent: Aug. 31, 1999

[54] METHOD FOR ETCHING DAMAGED ZONES ON AN EDGE OF A SEMICONDUCTOR SUBSTRATE, AND ETCHING SYSTEM

[75] Inventor: Josef Mathuni, München, Germany

[73] Assignee: Siemens Aktiengesellschaft, Munich, Germany

[21] Appl. No.: 08/867,115

[22] Filed: Jun. 2, 1997

[30] Foreign Application Priority Data

May 31, 1996 [DE] Germany ............................ 196 22 015

[51] Int. Cl.⁶ .................................................. H01L 29/30
[52] U.S. Cl. ......................... 438/706; 438/710; 438/715; 438/726; 438/727; 438/731; 438/745
[58] Field of Search ..................................... 438/706, 735

[56] References Cited

U.S. PATENT DOCUMENTS 4,350,562  9/1982  Bonü .
4,857,142  8/1989  Syverson .

FOREIGN PATENT DOCUMENTS 0 668 609 A2  8/1995  European Pat. Off. .

OTHER PUBLICATIONS

Abstract of "Chemical Etching of Silicon Wafer Rim", IBM Technical Disclosure Bulletin, Jun. 1981.
"Spin Etcher for Removal of Backside Depositions" (Gaulhofer), 400 Solid State Technology, vol. 34, No. 5, May 1991, pp. 57–58 and 219.

Japanese Patent Abstract No. 2–192717 (Isono), dated Jul. 30, 1990.
Japanese Patent Abstract No. 58–98925 (Ishikawa), dated Jun. 13, 1983.
Japanese Patent Abstract No. 1–196832 (Sato), dated Aug. 8, 1989.
Japanese Patent Abstract No. 7–142449 (Kiyotaka), dated Jun. 2, 1995.
Japanese Patent Abstract 07–142449 A (Masuda, K.) dated Jun. 2, 1995.
Japanese Patent Abstract 2–192717 (Kenji O.) dated Jul. 30, 1990.
Japanese Patent Abstract 58–98925 (Oonori I.) dated Jun. 13, 1983.
Japanese Patent Abstract 1–196832 (Mitsuo S.), dated Aug. 8, 1989.

*Primary Examiner*—Thi Dang
*Assistant Examiner*—Allan Olsen
*Attorney, Agent, or Firm*—Herbert L. Lerner; Laurence A. Greenberg

[57] ABSTRACT

The apparatus and method of the invention allow etching of the edge of a semiconductor substrate even where no resist is applied to the front side and back side of the semiconductor substrate. The semiconductor substrate is introduced into a protective chamber within an evacuatable process chamber. The front side and the back side of the semiconductor substrate are covered by the protective chamber except for the edge of the semiconductor substrate to be etched. The edge of the semiconductor substrate is then exposed to an etching agent. Etching products and excess etching agent are removed.

9 Claims, 2 Drawing Sheets

METHOD FOR ETCHING DAMAGED ZONES ON AN EDGE OF A SEMICONDUCTOR SUBSTRATE, AND ETCHING SYSTEM

BACKGROUND OF THE INVENTION

FIELD OF THE INVENTION

The invention relates to a method for etching damaged zones or destruction zones on an edge of a semiconductor substrate with a resist-free semiconductor substrate front side and a resist-free semiconductor substrate back side. The invention also relates to an etching system suitable for the etching process.

When silicon wafers are produced, the wafer edges are ground, to put them into a suitable form. These grinding processes create imperfections in the crystal, which in the ensuing machining processes can propagate from the edge toward regions which will be rendered active at a later point. This generally causes damage to or failure of the corresponding components.

Two processes have essentially been known in the art for eliminating these types of damage zones or imperfections. In one such process, the wafer edges are mechanically repolished. However, the imperfections that are located at a deeper level cannot be eliminated thereby. In the second process, the wafer is exposed to wet-chemical overetching, known as chemical polishing. However, the front side and back side of the semiconductor substrate must not also be removed, because that would impair the homogeneity of wafer thickness. The front and back sides of the semiconductor substrate are therefore suitably protected, and in particular they are coated with resist. These resist coatings account for high chemical consumption.

SUMMARY OF THE INVENTION

It is accordingly an object of the invention to provide a method for etching damaged zones on an edge of a semiconductor substrate, and an etching system, which overcomes the above-mentioned disadvantages of the heretofore-known devices and methods of this general type and which allows etching of the damaged zones without major consumption of chemicals.

With the foregoing and other objects in view there is provided, in accordance with the invention, a method of etching damaged zones on an edge of a semiconductor substrate having a resist-free front side and a resist-free back side, the method which comprises:

providing a process chamber and a protective chamber within the process chamber;

placing a semiconductor substrate with a substrate edge to be etched, with a resist-free front side, and with a resist-free back side into the protective chamber, covering the front side and the back side with the protective chamber, while leaving the substrate edge exposed in the process chamber; and etching the substrate edge with an etching agent, and removing etching products and excess etching agent.

This completely resist-free process for etching destruction zones ("damage layers") makes it possible to etch semiconductor substrate edges economically, very quickly, and in an environmentally friendly manner.

In accordance with an added mode of the invention, a protective gas is passed over the front side and back side of the semiconductor substrate. Introducing this protective gas assures that the front and back sides of the semiconductor substrate are especially well-protected against etching attack by the etching agent. As a rule, however, slightly elevated pressure (as compared to the process chamber itself) inside the protective chamber suffices and largely prevents the penetration of etching agent into it.

In accordance with an additional feature of the invention, the etchant is a gas or a gas mixture. The gas or gas mixture is furthermore preferably excited by microwave or high frequency excitation to form a plasma in a plasma generator separate from the process chamber. The etching process is thus carried out via radicals. Those skilled in the art will appreciate that method proceeds under vacuum conditions.

Alternatively, an etching solution is used as the etching agent. The etching solution is sprayed in fine droplets onto the semiconductor substrate edge to be etched. The semiconductor substrate and/or the process chamber is thereby heated to a temperature of $\leq 100°$ C., which assures an especially good chemical reaction between the edge of the semiconductor substrate and the etching solution. As a further result, no condensed etching solution forms on the semiconductor substrate and on the process chamber walls. The heating can be effected by a heating device or by the heat transfer from the protective gas.

With the above and other objects in view there is also provided, in accordance with the invention, a system for etching damaged zones on an edge of a semiconductor substrate, wherein the semiconductor substrate has a resist-free front side and a resist-free back side, comprising:

an etching reactor with a process chamber;

a structure defining a protective chamber within the process chamber for receiving a semiconductor substrate, the protective chamber having a first protective chamber part covering a resist-free front side of the semiconductor substrate and a second protective chamber part covering a resist-free back side of the semiconductor substrate, and the protective chamber leaving an edge of the semiconductor substrate to be etched exposed in the process chamber; and the process chamber being formed with an etching agent inlet through which an etching agent is brought to the edge of the semiconductor substrate.

In accordance with another feature of the invention, the protective chamber is formed with a protective gas inlet in each of said first and second protective chamber parts through which protective gas passes over the resist-free front side and the resist-free back side of the semiconductor substrate for protection against etching attack.

In accordance with yet another feature of the invention, there is provided a head plate disposed in said first protective chamber part and a foot plate disposed in said second protective chamber part, said head plate having an opening formed therein centrally above the front side of the semiconductor substrate, and said foot plate having an opening formed therein centrally below the back side of the semiconductor substrate, and wherein the protective gas flows through said openings and onto said front side and said back side, respectively.

In accordance with again an additional feature of the invention, the head plate and said foot plate each carry an inner baffle on a respective outer edge thereof. In addition, outer baffles surround said inner baffles of said head plate and said foot plate, said outer baffles defining the substrate edge to be etched, and said inner baffles and said outer baffles defining gaps therebetween for the removal of the protective gas from said protective chamber.

In accordance with again a further feature of the invention, there are provided at least three pins in said second protective chamber part on which the semiconductor substrate is supported.

In accordance with yet a further feature of the invention, there is provided a holder device disposed in said process chamber for supporting the semiconductor substrate at several points along an outer edge thereof. This assures that the semiconductor substrate is touched neither on its front nor its back side and is thereby protected against mechanical damage.

In accordance with a concomitant feature of the invention, the process chamber is one of a multitude of process chambers formed in said etching reactor. In other words, the etching system of the invention is preferably integrated into a so-called multichamber system, so that the insertion and removal of the semiconductor substrate to be etched may be fully automated, while other processing steps can take place directly inside this multichamber system.

Other features which are considered as characteristic for the invention are set forth in the appended claims.

Although the invention is illustrated and described herein as embodied in a method for etching destruction zones on an edge of a semiconductor substrate, and an etching system for performing the process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
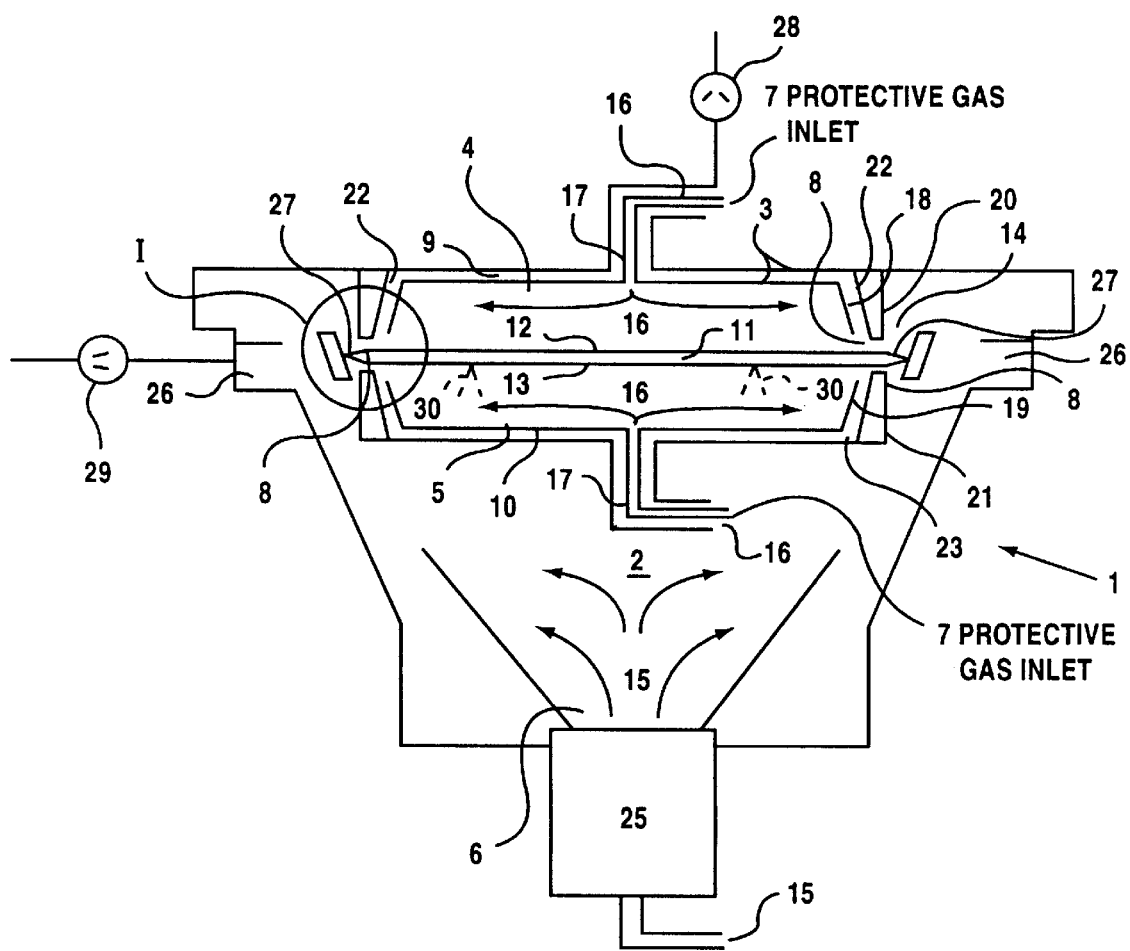
FIG. 1 is a schematic elevational view of the apparatus according to the invention.

Referring now to the figures of the drawing in detail and first, particularly, to FIG. 1 thereof, there is seen an part of an etching reactor 1 according to the invention with an evacuation device 29, which communicates with a process chamber 2.

A protective chamber 3 is disposed within the chamber 2. A disk-shaped semiconductor substrate 11 (silicon wafer) with a resist-free back side 13 and a resist-free front side 12 is placed in the protective chamber 3. In the present exemplary embodiment, the resist-free front side 12 has its face facing upward, i.e., it has been introduced into the protective chamber 3 in its natural position.

The protective chamber 3 comprises a first protective chamber part 4, disposed at the top in the process chamber 2, and a second protective chamber part 5, disposed at the bottom in the process chamber 2. The first protective chamber part 4 covers the front side 12 of the semiconductor substrate, and the second protective chamber part 5 covers the back side 13 of the semiconductor substrate. The edge 14 to be etched in the semiconductor substrate is not covered.

One protective gas inlet 7 each communicates with the first protective chamber part 4 and with the second protective chamber part 5. Through these protective gas inlets, a protective gas 16 is introduced to the resist-free front side 12 and the resist-free back side 13, respectively, of the semiconductor substrate. The protective gas guards the front and back sides against etching attack.

A head plate 9 is located in the region of the first protective chamber part 4. The head plate 9 has an opening 17 formed centrally above the front side 12 of the semiconductor substrate, through which the protective gas 16 flows to the front side 12 of the semiconductor substrate.

A foot plate 10 is located in the second protective chamber part 5 in an analogous way. The foot plate 10 likewise has an opening 17 formed centrally below the back side 13 of the semiconductor substrate. The protective gas flows through the central opening 17 to the back side 13.

The head plate 9 and the foot plate 10 each have a baffle 18, 19, respectively, on their outer edges pointing towards the semiconductor substrate 11. Outer baffles 20, 21 are disposed outside the baffles 18, 19. The outer baffles 20, 21 delineate the boundary between the process chamber 2 and the protective chamber 3, and they define the edge 14 of the semiconductor substrate to be etched.

Gaps 22, 23, which serve to remove the protective gas 16 by suction via an evacuation device 28, are formed between the baffles 18, 19, on the one hand, and the outer baffles 20, 21, on the other hand. The evacuation device 28 thus communicates directly with the upper protective chamber part 4 and the lower protective chamber part 5 of the protective chamber 3.

Figure 2:
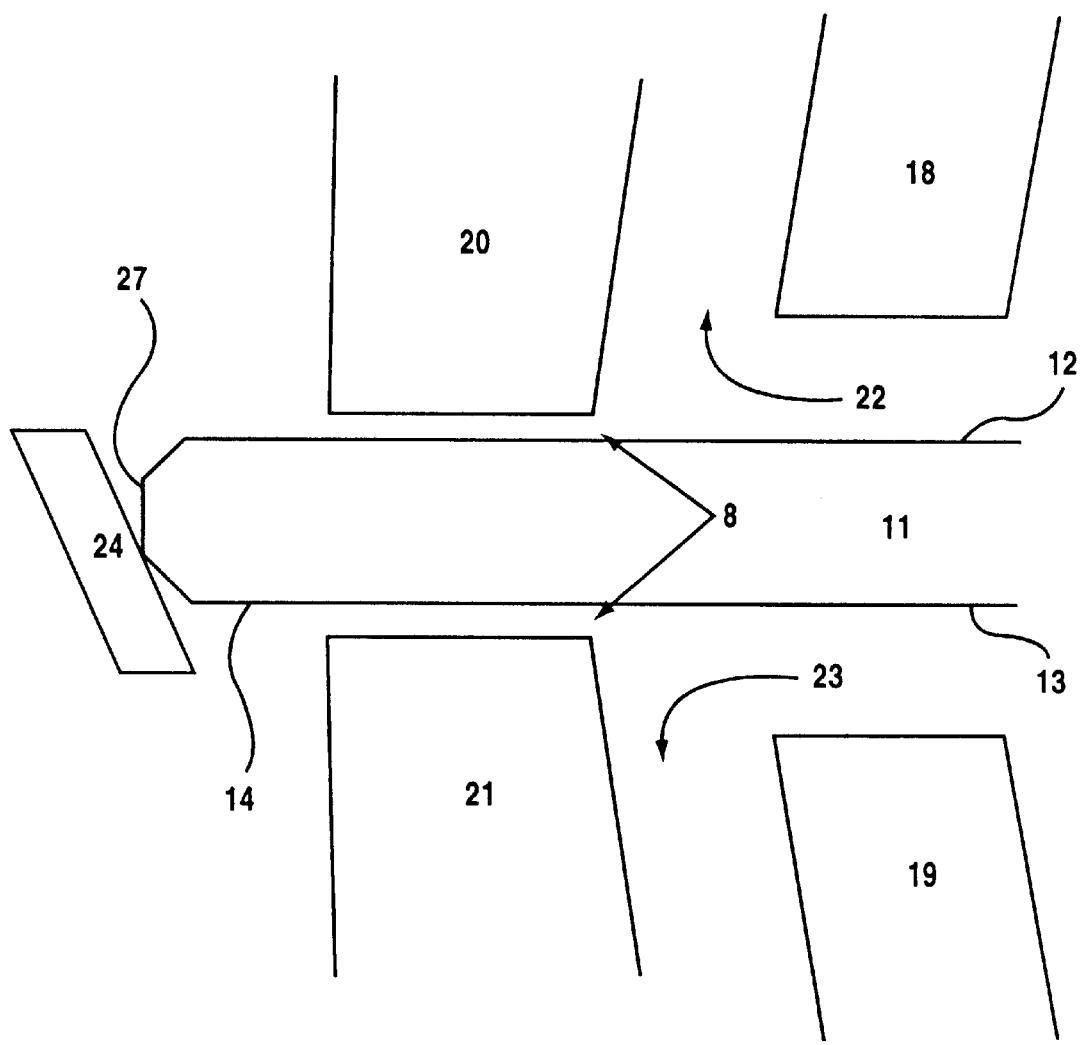
FIG. 2 is an enlarged view of a detail I in FIG. 1.

With particular reference to FIG. 2, the semiconductor substrate 11 in the present exemplary embodiment is held merely on its outer edge 27 by a holder device 24. The device 24 here comprises a plurality of pins disposed in the process chamber. In the alternative, the substrate may also rest on a plurality (preferably at least three) pins 30 inside the second protective chamber part 5. Spacing gaps 8 of approximately 0.1 mm exist between the outer baffles 20, 21 and the front side 12 and the back side 13, respectively, which are evacuated of any gas that has entered by suction. The gaps 22, 23 between the baffle 18 and the outer baffle 20, on the one hand, and the baffle 19 and the outer baffle 21, on the other hand, typically have a width of about 2 mm. The protective gas that has flowed in is removed by suction through these gaps 22, 23 as well. As a rule, nitrogen is used as the protective gas. However, argon or other noble gases may be used.

Etching agent 15 is introduced into the process chamber 2 through an etchant inlet 6 which issues into the process chamber 2. A mixed gas is used as the etching agent 15 in the present case. A preferred gas is a mixture of $CF_4$ and $O_2$, but other mixtures are also possible.

Prior to introduction into the process chamber, the gas mixture is excited by microwaves to form a plasma. The plasma is formed in a plasma generating chamber 25 separate from the process chamber 2.

The radicals thus produced reach the semiconductor substrate edge 14 to be etched, where they react with the semiconductor material in the destruction zones. The etching products and the excess etching gas mixture are removed by suction via the suction removal device 29, which communicates with the process chamber 2 at the level of the edge 14 of the semiconductor substrate. The removal device 29 communicates with an annular gap 26 formed in the process chamber walls at that level.

The outer baffles 20, 21 and the baffles 18, 19 are laterally displaceabe within the process chamber 2. The width of the edge 14 of the semiconductor substrate to be etched can thus be adjusted.

I claim:

1. A method of etching damaged zones on an edge of a semiconductor substrate having a resist-free front side and a resist-free back side, the method which comprises:

providing a process chamber and a protective chamber within the process chamber;

placing a semiconductor substrate with a substrate edge to be etched, with a resist-free front side, and with a resist-free back side into the protective chamber such that a gap exists between the resist-free back side and the protective chamber, covering the front side and the back side with the protective chamber, while leaving the substrate edge exposed in the process chamber; and etching the substrate edge with an etching agent, and removing etching products and excess etching agent.

2. A method of etching damaged zones on an edge of a semiconductor substrate having a resist-free front side and a resist-free back side, the method which comprises:

providing a process chamber and a protective chamber within the process chamber;

placing a semiconductor substrate with a substrate edge to be etched, with a resist-free front side, and with a resist-free back side into the protective chamber, covering the front side and the back side with the protective chamber, while leaving the substrate edge exposed in the process chamber;

passing a protective gas over the front side and over the back side of the semiconductor substrate; and etching the substrate edge with an etching agent, and removing etching products and excess etching agent.

3. The method according to claim 1, wherein the etching step comprises etching with an etchant gas.

4. The method according to claim 3, wherein the etchant gas is a gas mixture.

5. The method according to claim 3, which further comprises exciting the etchant gas to form a plasma, and evacuating the process chamber.

6. The method according to claim 5, wherein the exciting step comprises exciting the etchant gas with one of microwaves and high frequency electromagnetic waves.

7. The method according to claim 5, wherein the exciting step comprises generating the plasma in a plasma generating chamber separate from the process chamber.

8. The method according to claim 1, wherein the etching step comprises spraying etching solution onto the substrate edge.

9. The method according to claim 8, which further comprises heating at least one of the semiconductor substrate and the process chamber to a temperature of $\leq 100°$ C.

* * * * *